(12) United States Patent
Romano et al.

(10) Patent No.: US 7,344,961 B2
(45) Date of Patent: Mar. 18, 2008

(54) METHODS FOR NANOWIRE GROWTH

(75) Inventors: Linda T. Romano, Sunnyvale, CA (US); James M. Hamilton, Sunnyvale, CA (US)

(73) Assignee: Nanosys, Inc., Palo Alto, CA (US)

( * ) Notice: Subject to any disclaimer, the term of this patent is extended or adjusted under 35 U.S.C. 154(b) by 405 days.

(21) Appl. No.: 11/117,702

(22) Filed: Apr. 29, 2005

(65) Prior Publication Data
US 2006/0009003 A1    Jan. 12, 2006

Related U.S. Application Data

(60) Provisional application No. 60/653,574, filed on Feb. 16, 2005, provisional application No. 60/605,454, filed on Aug. 30, 2004, provisional application No. 60/586,170, filed on Jul. 7, 2004.

(51) Int. Cl.
*H01L 21/302* (2006.01)
(52) U.S. Cl. ...................... 438/478; 977/762
(58) Field of Classification Search ............... 977/762, 977/856; 438/478, 689–700
See application file for complete search history.

(56) References Cited

U.S. PATENT DOCUMENTS

| 5,196,396 A | 3/1993 | Lieber et al. |
| 5,252,835 A | 10/1993 | Lieber et al. |
| 5,274,602 A | 12/1993 | Glen et al. |
| 5,332,910 A | 7/1994 | Haraguchi et al. |
| 5,338,430 A | 8/1994 | Parsonage et al. |
| 5,505,928 A | 4/1996 | Alivisatos et al. |
| 5,512,131 A | 4/1996 | Kumar et al. |
| 5,640,343 A | 6/1997 | Gallagher et al. |

(Continued)

FOREIGN PATENT DOCUMENTS

WO    WO-9629629    9/1996

(Continued)

OTHER PUBLICATIONS

Dabbousi, B.O. et al. "(CdSe)ZnS core-shell quantum dots: Synthesis and Characterization of a size series of highly luminescent nanocrysallites" *J. Phys. Chem. B* (1997) 101:9463-9475.

(Continued)

*Primary Examiner*—Savitri Mulpuri
(74) *Attorney, Agent, or Firm*—Andrew L. Filler; Sterne, Kessler, Goldstein & Fox PLLC

(57) ABSTRACT

The present invention is directed to methods to produce, process, and exploit nanomaterials, and particularly elongated nanowire materials. The invention provides a method for producing nanowires that includes providing a thin film of a catalyst material with varying thickness on a substrate, heating the substrate and thin film, such that the thin film disassociates at the relatively thinner regions and vapor depositing a semiconductor onto the substrate to produce nanowires. A method is also provided in which two or more thin films of different materials are overlayed over a substrate, selectively etching the first underlying thin film to create a plurality of islands of the second thin film that mask portions of the first thin film and expose other portions and growing nanowires on the first thin film. Additional methods for producing nanowires are provided.

12 Claims, 8 Drawing Sheets

U.S. PATENT DOCUMENTS

| | | | |
|---|---|---|---|
| 5,674,592 A | 10/1997 | Clark et al. | |
| 5,690,807 A | 11/1997 | Clark, Jr. et al. | |
| 5,751,018 A | 5/1998 | Alivisatos et al. | |
| 5,840,435 A | 11/1998 | Lieber et al. | |
| 5,858,862 A | 1/1999 | Westwater et al. | |
| 5,897,945 A | 4/1999 | Lieber et al. | |
| 5,953,595 A | 9/1999 | Gosain et al. | |
| 5,962,863 A | 10/1999 | Russell et al. | |
| 5,976,957 A | 11/1999 | Westwater et al. | |
| 5,990,479 A | 11/1999 | Weiss et al. | |
| 5,997,832 A | 12/1999 | Lieber et al. | |
| 6,004,444 A | 12/1999 | Aksay et al. | |
| 6,036,774 A | 3/2000 | Lieber et al. | |
| 6,048,616 A | 4/2000 | Gallagher et al. | |
| 6,128,214 A | 10/2000 | Kuekes et al. | |
| 6,136,156 A | 10/2000 | El-Shall et al. | |
| 6,159,742 A | 12/2000 | Lieber et al. | |
| 6,190,634 B1 | 2/2001 | Lieber et al. | |
| 6,207,229 B1 | 3/2001 | Bawendi et al. | |
| 6,225,198 B1 | 5/2001 | Alivisatos et al. | |
| 6,235,675 B1 | 5/2001 | McIlroy | |
| 6,248,674 B1 | 6/2001 | Kamins et al. | |
| 6,256,767 B1 | 7/2001 | Kuekes et al. | |
| 6,274,007 B1 | 8/2001 | Smirnov et al. | |
| 6,306,736 B1 | 10/2001 | Alivisatos et al. | |
| 6,322,901 B1 | 11/2001 | Bawendi et al. | |
| 6,380,103 B2 | 4/2002 | Gonzalez et al. | |
| 6,383,923 B1 | 5/2002 | Brown et al. | |
| 6,413,489 B1 | 7/2002 | Ying et al. | |
| 6,438,025 B1 | 8/2002 | Skarupo | |
| 6,447,663 B1 | 9/2002 | Lee et al. | |
| 6,471,761 B2 | 10/2002 | Fan et al. | |
| 6,566,704 B2 | 5/2003 | Choi et al. | |
| 6,586,785 B2 | 7/2003 | Flagan et al. | |
| 6,760,245 B2 | 7/2004 | Eaton et al. | |
| 6,773,616 B1 | 8/2004 | Chen et al. | |
| 6,798,000 B2 | 9/2004 | Luyken et al. | |
| 6,815,218 B1 | 11/2004 | Jacobson et al. | |
| 6,815,750 B1 | 11/2004 | Kamins | |
| 6,831,017 B1 | 12/2004 | Li et al. | |
| 6,858,455 B2 | 2/2005 | Guillom et al. | |
| 6,872,645 B2 * | 3/2005 | Duan et al. | 438/584 |
| 6,878,871 B2 | 4/2005 | Scher et al. | |
| 6,882,051 B2 | 4/2005 | Majumdar et al. | |
| 7,078,276 B1 * | 7/2006 | Zurcher et al. | 438/151 |
| 2001/0023986 A1 | 9/2001 | Mancevski | |
| 2002/0005876 A1 | 1/2002 | Grimes et al. | |
| 2002/0014667 A1 | 2/2002 | Shin et al. | |
| 2002/0104762 A1 | 8/2002 | Stonas et al. | |
| 2002/0117659 A1 | 8/2002 | Lieber et al. | |
| 2002/0125192 A1 | 9/2002 | Lopez et al. | |
| 2002/0127495 A1 | 9/2002 | Scherer | |
| 2002/0130311 A1 | 9/2002 | Lierber et al. | |
| 2002/0130353 A1 | 9/2002 | Lieber et al. | |
| 2002/0158342 A1 | 10/2002 | Tuominen et al. | |
| 2002/0163079 A1 | 11/2002 | Awano | |
| 2002/0175408 A1 | 11/2002 | Majumdar et al. | |
| 2003/0012723 A1 | 1/2003 | Clarke | |
| 2003/0042562 A1 | 3/2003 | Giebeler et al. | |
| 2003/0044777 A1 | 3/2003 | Beattie | |
| 2003/0049875 A1 | 3/2003 | Sheu et al. | |
| 2003/0071246 A1 | 4/2003 | Grigorov | |
| 2003/0089899 A1 | 5/2003 | Lieber et al. | |
| 2003/0186522 A1 | 10/2003 | Duan et al. | |
| 2003/0189202 A1 | 10/2003 | Li et al. | |
| 2004/0005258 A1 | 1/2004 | Fonash et al. | |
| 2004/0026684 A1 | 2/2004 | Empedocles | |
| 2004/0031975 A1 | 2/2004 | Kern et al. | |
| 2004/0036126 A1 | 2/2004 | Chau et al. | |
| 2004/0036128 A1 | 2/2004 | Zhang et al. | |
| 2004/0061422 A1 | 4/2004 | Avouris et al. | |
| 2004/0095658 A1 | 5/2004 | Buretea et al. | |
| 2004/0112964 A1 | 6/2004 | Empedocles et al. | |
| 2004/0135951 A1 | 7/2004 | Stumbo et al. | |
| 2004/0146560 A1 | 7/2004 | Whiteford et al. | |
| 2005/0064618 A1 | 3/2005 | Brown et al. | |
| 2005/0066883 A1 | 3/2005 | Dubrow et al. | |
| 2005/0079659 A1 | 4/2005 | Duan et al. | |
| 2005/0145596 A1 | 7/2005 | Metz et al. | |
| 2005/0176245 A1 | 8/2005 | Melechko et al. | |
| 2005/0191419 A1 * | 9/2005 | Helt | 427/256 |
| 2005/0230356 A1 * | 10/2005 | Empedocles et al. | 217/2 |
| 2005/0279274 A1 | 12/2005 | Niu et al. | |
| 2006/0024860 A1 * | 2/2006 | Wada et al. | 438/99 |
| 2006/0046480 A1 * | 3/2006 | Guo | 438/685 |
| 2007/0032091 A1 * | 2/2007 | Heald et al. | 438/758 |

FOREIGN PATENT DOCUMENTS

| | | |
|---|---|---|
| WO | WO-01003208 | 1/2001 |
| WO | WO-02017362 | 2/2002 |
| WO | WO-02048701 | 6/2002 |
| WO | WO-02080280 | 10/2002 |
| WO | WO-03085700 | 10/2003 |
| WO | WO-03085701 | 10/2003 |
| WO | WO-2004032161 | 4/2004 |
| WO | WO-2004032193 | 4/2004 |
| WO | WO-2005023923 | 3/2005 |

OTHER PUBLICATIONS

Derycke, V. et al., "Carbon Nanotube Inter-and Intramolecular Logic Gates" *Nano Letters* (2001) 1(9):453-456.

Duan, X. et al., "General synthesis of compound semiconductor nanowires" *Adv. Meter.* (2000) 12:298-302.

Duan, X. et al., "High performance thin-film transistors using semiconductor nanowires and nanoribbons" *Nature* (2003) 425:274-278.

Greene, L. et al. "Low-temperature wafer scale production of ZnO nanowire arrays", *Angew. Chem. Int. Ed.* (2003) 42:3031-3034.

Gudiksen, M.S. et al "Diameter-selective synthesis of semiconductor nanowires" *J Am. Chem. Soc.* (2000) 122:8801-8802.

Gudiksen, M.S. et al. "Synthetic control of the diameter and length of single crystal semiconductor nanowires" *J. Phys. Chem. B* (2001) 105:4062-4064.

Gudiksen, M.S. et al. "Growth of nanowire superlattice structures for nanoscale photonics and electronics" *Nature* (2002) 415:617-620.

Haraguchi, K. et al., "Polarization Dependence of Ligh Emitted from GaAs p-n junctions in quantum wire crystals"*J. Appl. Phys.* (1994) 75(8):4220-4225.

Haraguchi, K. et al., "Self Organized Fabrication of Planar GaAs Nanowhisker Arrays" *Appl. Phys. Lett.* (1996) 69(3):386-387.

Hiruma, K. et al., "GaAs Free Standing Quantum Sized Wires" *J. Appl. Phys.* (1993) 74(5):3162-3171.

Huang, Y. et al., "Directed Assembly of One-Dimensional Nanostructures into Functional networks" *Science* (2001) 291:630-633.

Huang, Y. et al., "Logic Gates and Computation from Assembed Nanowire Building Blocks" *Science* (2001) 294:1313-1317.

Jun, Y-W. et al. "Controlled synthesis of multi-armed CdS nanorod architectures using monosurfactant system" *J. Am. Chem. Soc.* (2001) 123:5150-5151.

Kong, J. et al. "Synthesis of individual single-walled carbon nanotubes on patterned silicon wafers" *Natures* (1998) 395-878-881.

Kong, J. et al., "Chemical vapor deposition of methane for single-walled carbon nanotubes" *Chem. Phys. Lett.* (1998) 292:567-574

Kong, J. et al., "Nanotube molecular wires as chemical sensors" *Science* (2000) 287:622-625.

Bachtold, A. et al., "Logic Circuits with Carbon Nanotube Transistors" *Science* (2001) 294:1317-1320.

Bjork, M.T. et al. "One-dimensional steeplechase for electrons realized" *Nano Letters* (2002) 2:86-90.

Cao, Y. et al. "Growth and properties of semiconductor core/shell nanocrystals with InAs cores" *J. Am. Chem. Soc.* (2000) 122:9692-9702.

Chen, J. et al., "Observation of a Large On-Off Ratio and Negative Differential Resistance in an Electronic Molecular Switch" *Science* (1999) 286:1550-1552.

Chung, S-W et al., "Silicon Nanowire Devices" *App. Phys. Letts.* (2000) 76(15):2068-2070.

Collier, C.P. et al., "Electronically Configurable Molecular-Based Logic Gates" *Science* (1999) 285:391-394.

Cui, Y. et al. "Doping and electrical transport in silicon nanowires" *J. Phys. Chem. B* (2000) 104:5213-5216.

Cui, Y et al. "Diameter-controlled synthesis of single-crystal silicon nanowires" *Appl. Phys. Lett.* (2001) 78:2214-2216.

Cui, Y. et al., "Functional Nanoscale electronic devices assembled using silicon nanowire building blocks" *Science* (2001) 291:851-853.

Liu, C. et al. "Sol-Gel Syntheis of Free-Standing Ferroelectric Lead Zirconate Titanate Nanoparticles" *J. Am. Chem. Soc.* (2001) 123:4344-4345.

Manalis, S.F. et al., "Microvolume field-effect pH sensor for the scanning probe microscope" *Applied Phys. Lett.* (2000) 76:1072-1074.

Manna, L. et al. "Synthesis of Soluble and Processable Rod-,Arrow-, Teardrop-, and Tetrapod-Shaped CdSe Nanocrystals" *J. Am. Chem. Soc.* (2000) 122:12700-12706.

Manna, L. et al. "Epitaxial growth and photochemical annealing of graded CdS/ZnS shells on colloidal CdSe nanorods" *J. Am. Chem. Soc.* (2002) 124:7136-7145.

Morales, A.M. et al. "A laser ablation method for the synthesis of crystalline semiconductor nanowires" *Science* (1998) 279:208-211.

Peng, X et al. "Epitaxial growth of highly luminescent CdSe/CdS core/shell nanocrystals with photostability and electronic accessibility" *J. Am. Chem. Soc.* (1997) 119:7019-7029.

Peng, X. et al. "Shape Control of CdSe Nanocrystals" *Nature* (2000) 404:59-61.

Puntes, V.F. et al. "Colloidal nanocrystals shape and size control: The case of cobalt" *Science* (2001) 291:2115-2117.

Schon J.H. et al., "Field-effect modulation of the conductance of single molecules" *Science* (2001) 294:2138-2140.

Schon, J.H. et al., "Self-assembled monolayer organic field-effect transistors" (2001) *Nature* 413:713-716.

Service, R.F., "Assembling nanocircuits from the bottom up" *Science* (2001) 293:782-785.

Tang, et al., "Synthesis of InN Nanowires Using a Two-Zone Chemical Vapor Deposition Approach" *IEEE* (Aug. 14, 2003) 205-207.

Tans, S.J. et al., "Room-temperature transistor based on a single carbon nanotube" *Nature* (1998) 393:49-52.

Thess, A. et al., "Crystalline ropes of metallic carbon nanotubes" (1996) *Science* 273:483-486.

Tseng, G.Y. et al., "Toward nanocomputers" (2001) *Science* 294:1293-1294.

Urban, J.J. et al. "Synthesis of single-crystalline perovskite nanowires composed of barium titanate and strontium titanate" *J. Am. Chem. Soc.* (2002) 124(7):1186-1187.

Wang et al., "Low Temperature Synthesis of Single-Crystal Germanium Nanowires by Chemical Vapor Deposition" *Angew. Chem. Int. Ed.* (2002) 41(24):4783-4786.

Wu, Y et al. "Block-by-block growth of single-crystalline Si/SiGe superlattice nanowires" *Nano Letters* (2002) 2(2):83-86.

Yamada, T. "Analysis of submicron carbon nanotube field-effect transistors" *Appl. Phys Letts* (2000) 76(5):628-630.

Yazawa, M. et al. "Semiconductor nanowhiskers" *Adv. Mater.* (1993) 5(7/8):577-580.

Yun, W.S. et al. "Ferroelectric Properties of Individual Barium Titanate Nanowires Investigated by Scanned Probe Microscopy" *Nanoletters* (2002) 2(5):447-450.

Zhou, C. et al., "Nanoscale metal/self-assembled monolayer/metal heterostructures" *Applied Phys. Lett* (1997) 71:611-613.

Givargizov, E.I. "Fundamental Aspects of VLS Growth" *J. Cryst. Growth* (1975) 31:20-30.

Wagner, R.S. et al., "Vapor-Liquid-Solid mechanism of single crystal growth" *Appl. Phys. Lett.* (1964) 4(5):89-90.

* cited by examiner

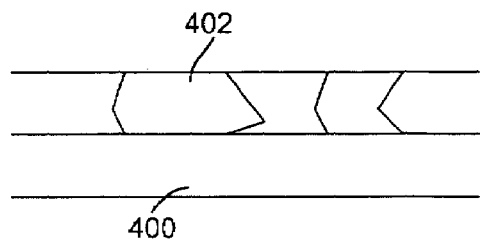
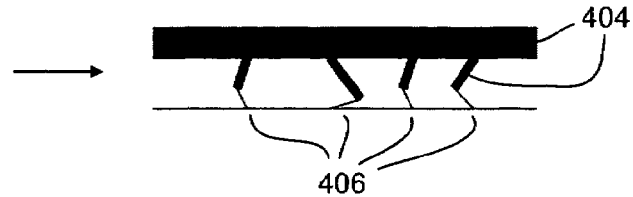
FIG. 4A  FIG. 4B
FIG. 4C  FIG. 4D
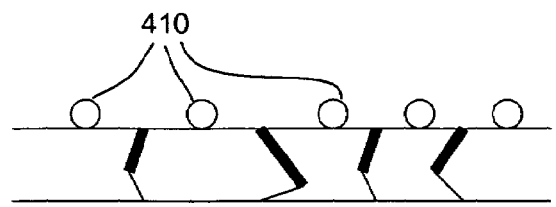
FIG. 4E

METHODS FOR NANOWIRE GROWTH

CROSS REFERENCE TO RELATED APPLICATIONS

The present application claims the benefit of the filing dates of U.S. Provisional Patent Application No. 60/586,170, filed Jul. 7, 2004, U.S. Provisional Patent Application No. 60/605,454, filed Aug. 30, 2004 and U.S. Provisional Patent Application No. 60/653,574, filed Feb. 16, 2005, the disclosures of which applications are incorporated by reference herein in their entireties.

BACKGROUND OF THE INVENTION

1. Field of the Invention

The present invention relates to nanowires, and more particularly, to nanowire growth.

2. Background of the Invention

Nanomaterials, and in particular, nanowires have the potential to facilitate a whole new generation of electronic devices. For example, In certain cases, uses of nanomaterials have been proposed that exploit the unique and interesting properties of these materials more as a bulk material than as individual elements requiring individual assembly. For example, Duan et al., *Nature* 425:274-278 (September 2003), describes a nanowire based transistor for use in large area electronic substrates, such as, displays, antennas, and the like that employ a bulk processed, oriented semiconductor nanowire film or layer in place of a rigid semiconductor wafer. The result is an electronic substrate that performs on par with a single crystal wafer substrate that can be manufactured using conventional and less expensive processes than those used to manufacture poorer performing amorphous semiconductors, which is also more amenable to varied architectures, such as, flexible and/or shaped materials.

In another example, bulk processed nanocrystals have been described for use as a flexible and efficient active layer for photoelectric devices. In particular, the ability to provide a quantum confined semiconductor crystal in a hole conducting matrix (to provide a type-II bandgap offset), allows the production of a photoactive layer that can be exploited either as a photovoltaic device or photoelectric detector. When disposed in an active composite, these nanomaterials are simply processed using standard film coating processes. See, e.g., U.S. patent application Ser. No. 10/656,802, filed Sep. 4, 2003, which is incorporated herein by reference in its entirety.

In accordance with these uses of nanowires and other nanomaterials, the new process requirement is the ability to provide a film of nanowires that are substantially oriented along a given axis. The technology for such orientation has already been described in detail in, for example, International Publication Nos. WO 03/085700, WO 03/085701 and WO 2004/032191, as well as U.S. patent application Ser. No. 10/673,092, filed Sep. 25, 2003, which all are incorporated herein by reference in their entirety.

A major impediment to the emergence of this new generation of electronic devices based on nanostructures is the ability to effectively grow nanowires and other nanostructures that have consistent characteristics. Current approaches to grow nanowires do not facilitate mass production, do not yield consistent nanowire performance characteristics and can be improved to generate better device performance based on nanowires.

What are needed are systems and methods for growing nanowires that facilitate mass production, yield consistent nanowire performance characteristics and generate improved device performance.

SUMMARY OF THE INVENTION

The present invention provides methods for growing nanowires that facilitate mass production, yield consistent nanowire performance characteristics and generate improved device performance. A primary benefit is the use of such materials in large area electronics applications.

In a first aspect of the invention, the invention provides a method for producing nanowires, that comprises placing a thin film of a catalyst material on a substrate, the thin film having periodic thickness variations that include relatively thicker regions of the thin film and relatively thinner regions of the thin film. The substrate and thin film are heated to a temperature at which the thin film melts, whereupon the melting thin film disassociates from itself at the relatively thinner regions. A semiconductor is then vapor deposited onto the first substrate, and nanowire growth is catalyzed by the catalyst material.

In another aspect of the invention, the invention provides a method for producing nanowires comprising providing thin film of a first catalyst material on a growth substrate, overlying the first thin film with at least one second thin film made from a second material different than the first catalyst material, the second thin film forming a plurality of islands on the first thin film. The first underlying thin film is selectively etched, such that a set of islands of the second thin film mask selected portions of the underlying first thin film and expose other regions of the first thin film that can be selectively removed by etching. A population of nanowires can then be grown on the first thin film.

The second thin film may optionally be removed by etching (e.g., using a wet etchant) following etching of the selected regions of the first thin film. The remaining portions of the first thin film not removed by etching form islands that can then be used to nucleate nanowire growth. The growth substrate and first thin film are heated to a temperature at which the first thin film melts. Concurrently, a semiconductor is vapor deposited onto the first substrate, and nanowire growth is catalyzed by the first catalyst material.

Additionally, the final etched substrate may be coated with a colloid suspension of the first catalyst material. If the colloid has an affinity for the remaining portions of the first thin film not removed by etching, but not the underlying substrate, these colloids will co-locate with the remaining portions of the first thin film. The first thin film and colloid composite can then be used to initiate nanowire growth. Alternatively, if the colloids have an affinity for the underlying substrate, but not the remaining regions of the first thin-film not removed by etching, these colloids will co-locate with the exposed underlying substrate regions. The first thin-film and colloids can then be used to initiate nanowire growth simultaneously in different regions of the substrate.

The first thin film can be thinner than the second thin film, or alternatively the first thin film may be thicker than the second thin film. In one embodiment, the first thin film may be Au or Cr (or any other suitable metal catalytic film), and the second thin film may be Cr or Au (or any other suitable film that is preferably differentially etchable from the first thin film). Alternatively, a single thin film of material may be overlaid and form islands on a thin silicon layer on a silicon-on-insulator (SOI) substrate, and then the silicon layer etched (e.g., by dry etching) to leave selected portions of silicon on the SOI substrate. The thin silicon layer remaining on the substrate forms islands which can be used to nucleate nanowire wire.

In another related aspect of the invention, the invention provides a method for producing nanowires that comprises providing a thin film of a catalyst material on a first substrate, the film forming a plurality of catalyst islands on the substrate of a first island density; partially etching one or more selected regions of the thin film where nanowire growth is desired leaving a subset of catalyst islands at a lower island density than the first density in the one or more regions; and growing a population of nanowires in the one or more partially etched regions from the remaining subset of catalyst islands. The thin film is preferably less than about 10 nm in thickness, for example between about 1 to about 7 nm in thickness, for example between about 1 and 5 nm in thickness. Such nano-thickness films form catalyst islands which can be used to nucleate the growth of nanowires. Controlled etching of selected regions of such films reduces the island density in those regions which enables the growth of isolated and substantially oriented nanowires while minimizing background growth in the etched regions, thus simplifying post-growth processing of the wires.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

FIGS. 4A-4E schematically illustrates a process of synthesizing nanowires using a VLS method by employing inherent perturbations in a catalyst film on a substrate.

DETAILED DESCRIPTION OF THE INVENTION

Figure 1A:
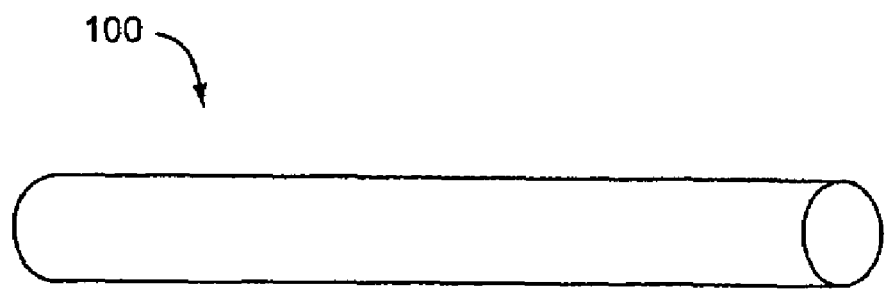
FIG. 1A is a diagram of a single crystal semiconductor nanowire.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length: width) of greater than 10, preferably greater than 50, and more preferably, greater than 100.

The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, $(Cu, Ag)(Al, Ga, In, Ti, Fe)(S, Se, Te)_2$, $Si_3N_4$, $Ge_3N_4$, $Al_2O_3$, $(Al, Ga, In)_2 (S, Se, Te)_3$, $Al_2CO$, and an appropriate combination of two or more such semiconductors.

The nanowires can also be formed from other materials such as metals such as gold, nickel, palladium, iradium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom", etc.) made herein are for purposes of illustration only, and that devices of the present invention can be spatially arranged in any orientation or manner.

Nanomaterials have been produced in a wide variety of different ways. For example, solution based, surfactant mediated crystal growth has been described for producing spherical inorganic nanomaterials, e.g., quantum dots, as well as elongated nanomaterials, e.g., nanorods and nanotetrapods. Other methods have also been employed to produce nanomaterials, including vapor phase methods. For example, silicon nanocrystals have been reported produced by laser pyrolysis of silane gas.

Other methods employ substrate based synthesis methods including, e.g., low temperature synthesis methods for producing, e.g., ZnO nanowires as described by Greene et al. ("Low-temperature wafer scale production of ZnO nanowire arrays", L. Greene, M. Law, J. Goldberger, F. Kim, J. Johnson, Y. Zhang, R. Saykally, P. Yang, Angew. *Chem. Int. Ed.* 42, 3031-3034, 2003), and higher temperature VLS methods that employ catalytic gold particles, e.g., that are deposited either as a colloid or as a thin film that forms a particle upon heating. Such VLS methods of producing nanowires are described in, for example, Published International Patent Application No. WO 02/017362, the full disclosure of which is incorporated herein by reference in its entirety for all purposes.

Types of Nanowires and Their Synthesis

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
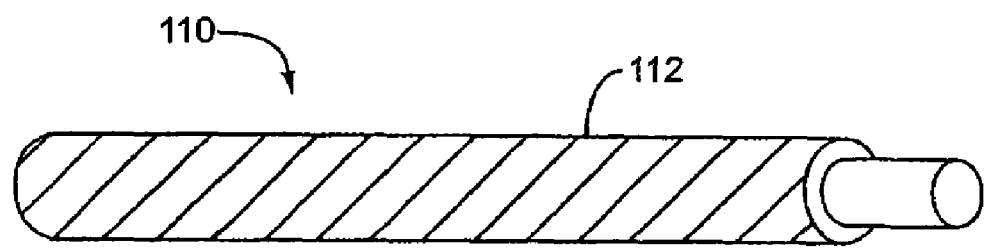
FIG. 1B is a diagram of a nanowire doped according to a core-shell structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105,4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.,* 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-,Arrow-, Teardrop-, and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "*Epitaxial growth and photochemical annealing of graded CdS/ZnS shells on colloidal CdSe nanorods*" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

Exemplary Nanowire Devices

Figure 2A:
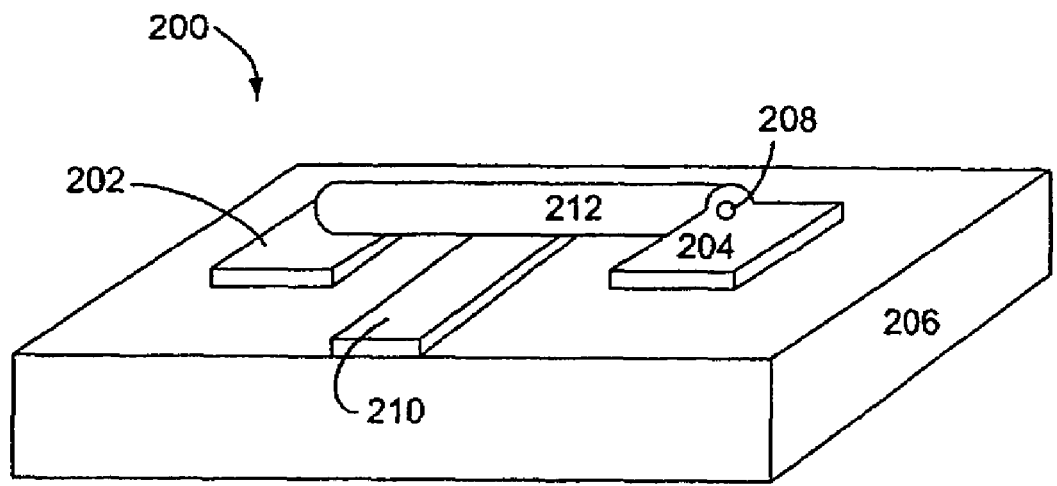
FIG. 2A is a diagram of a nanowire based transistor device.

Exemplary applications of semiconductor nanowire materials include simple electronic components, such as, transistors. For example, a simple nanowire transistor device is shown in FIG. 2A. As shown, the basic device 200 includes a source electrode 202 and a drain electrode 204 disposed upon a substrate 206 and spaced apart from each other. A semiconductor nanowire 208 is provided spanning the two electrodes and is electrically connected to the electrodes 202 and 204. The transistor typically includes an insulator or dielectric layer over its surface that provides insulation between the nanowire 208 and, for example, gate electrode 210. As shown, the dielectric layer is provided as an oxide shell 212 or coating on the nanowire 208. By modulating the field applied to the gate electrode 210, one can vary the conductivity of the nanowire 208 as in a conventional field effect transistor (FET).

Figure 2B:
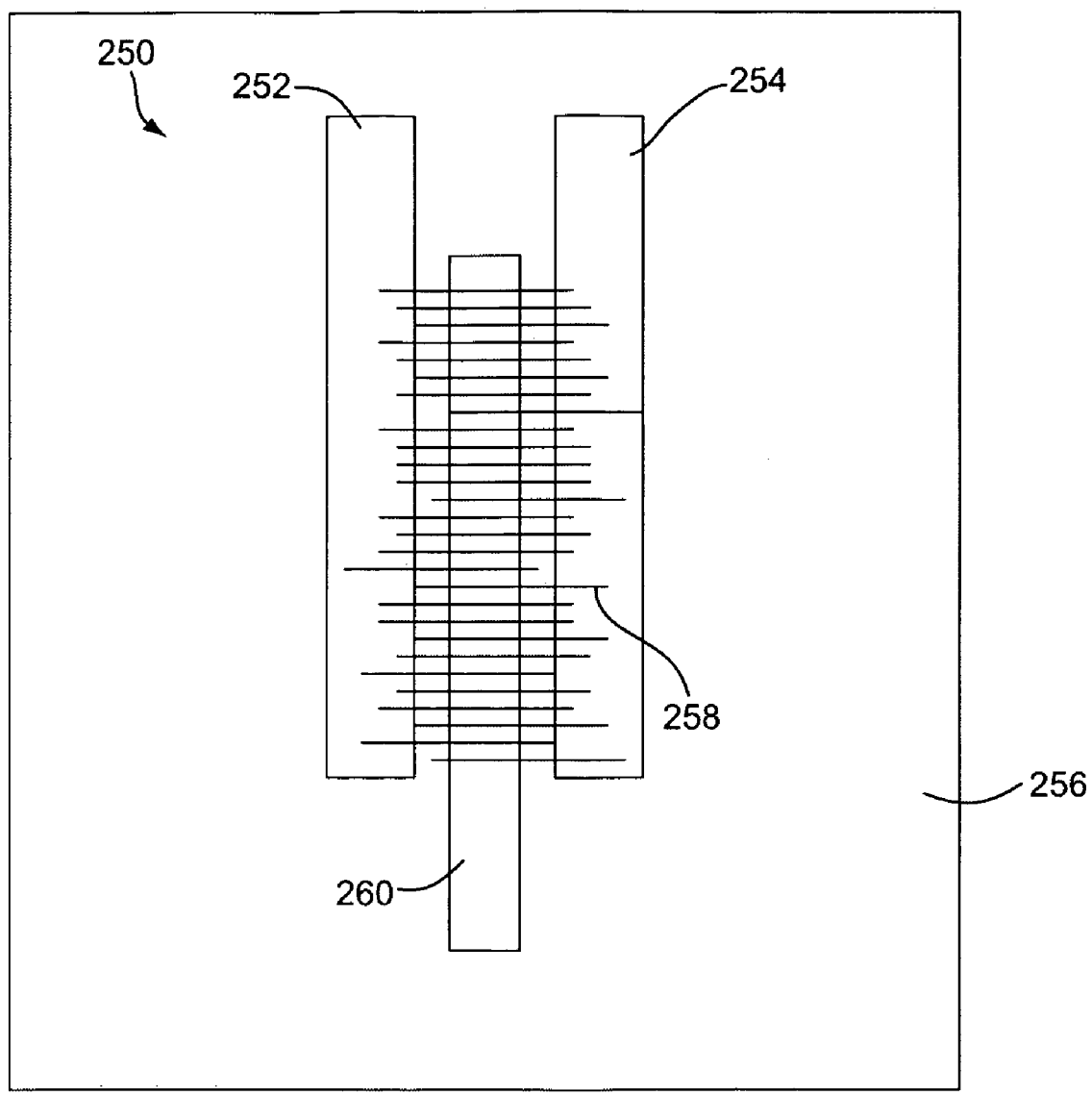
FIG. 2B is a diagram of a nanowire based transistor device having a film of oriented nanowires employed as the conductive channel.

FIG. 2B schematically illustrates a variation of the simple device shown in FIG. 2A. As shown, the transistor device 250 includes source 252, drain 254 and gate 260 electrode provided upon a substrate 256. However, in place of a single nanowire with a dielectric shell is a film or population of substantially oriented nanowires 258 that span the source and drain electrodes 252 and 254, bridging the gate electrode 260. As compared to the device illustrated in FIG. 2A, the nanowire film 258 provides a much higher current density than a single nanowire based device, while retaining processibility advantages of film-based processing and uniformity. In particular, the fact that some of the nanowires in the nanowire population do not completely span the source and drain electrodes does not substantively affect the operation of the device as the overwhelming number of nanowires will provide this functionality.

Growth of Nanowires from Films

Figure 3:
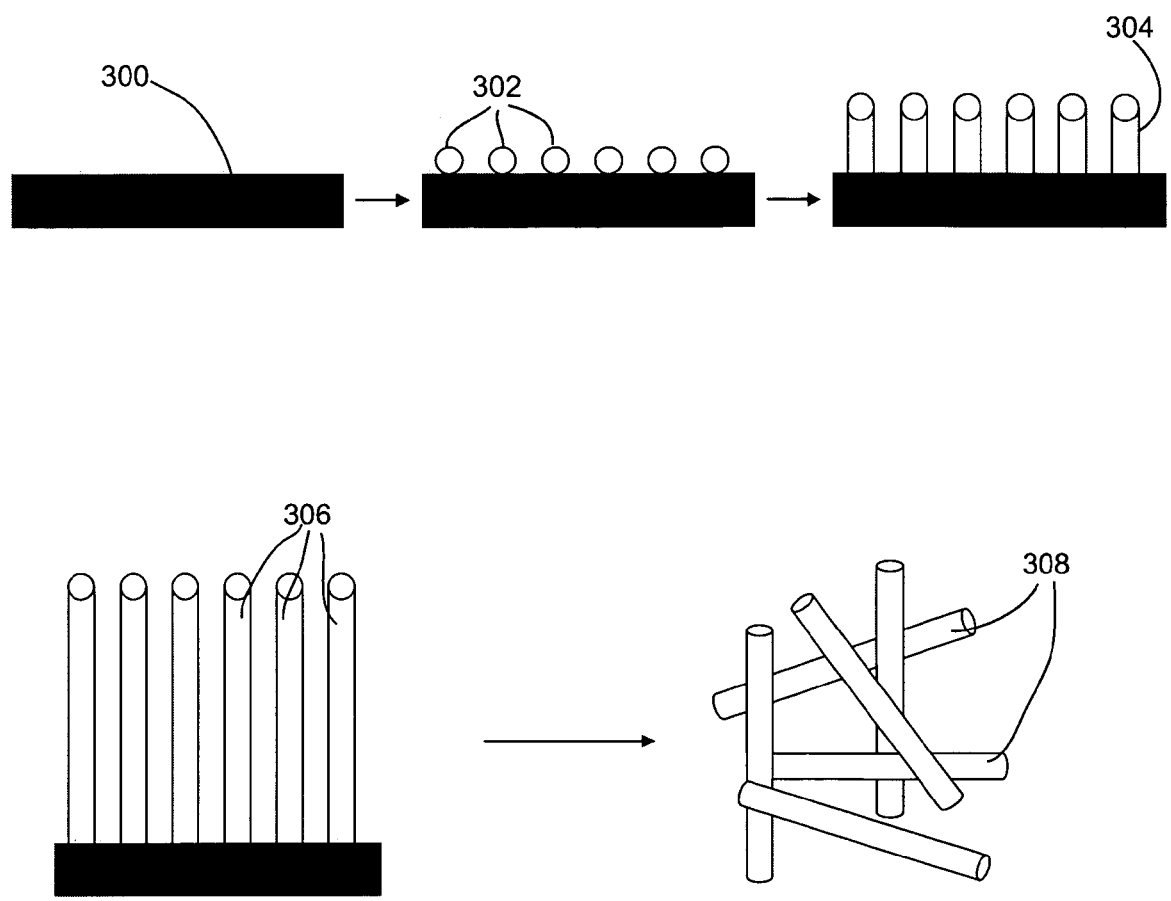
FIG. 3 is a schematic illustration of a typical nanowire synthesis process using a catalyst driven VLS process.

FIG. 3 provides a schematic illustration of a typical nanowire synthesis process using a catalyst driven VLS process that is the basis from which a number of aspects of the present invention derive. Briefly, as shown, a substrate 300 is provided upon which nanowires will be synthesized. A population of catalytic particles 302, for example, gold or other metal colloids, are then deposited upon the substrate surface. The particles may be provided as such, for example, as a population of colloidal particles, or they may be provided as a thin film on the substrate that is then formed into particles, for example, by heating and coalescence of the film. The substrate and particles are then exposed to elevated temperatures, for example, from about 300° C. to 800° C., for example, about 600° C. to 800° C. in the presence of a semiconductor precursor gas, for example, $SiCl_4$. Other precursor gases will be known to individuals skilled in the relevant arts. Super saturation of the metal particle with the semiconductor then results in the crystallization of the semiconductor in a form that is defined by the diameter of the supersaturated particle, forming a cylindrical semiconductor wire 304. Continued growth then elongates the nanowire until wires 306 of a desired length are achieved. For many applications, the grown nanowires are then harvested from the substrate to yield a population of free standing or suspended nanowires 308.

Certain aspects of the invention are directed to improved processes for synthesizing nanowires from films of catalyst materials, for example, metallic films. In particular, in contrast to previously described processes, this aspect of the invention provides for use of other types of films as the catalytic component for nanowire growth. Use of non-gold materials provides benefits of tunability of the overall process by providing variations in the properties of the film that is used, as well as provides benefits of lower cost, alternative nanowire composition, and altered processing parameters, for example, lower temperature melting point metal catalytic films for nanowire synthesis, for example, having a lower melting temperature than gold. Use of low melting point metal films allows the use of a broader range of substrate materials including, for example, polymeric materials that have elevated melting temperatures, because such metals will tend to form eutectics with the semiconductor material being used for nanowire growth at lower temperatures, for example, temperatures less than about 400° C., and thus will not damage the underlying substrate.

Examples of useful low melting temperature metals include, for example, In, Cd, Sn, Zn, or alloys thereof, and the like. Typically, any metal that generate eutectics with the semiconductor material being used for nanowire growth at a temperature less than about 400° C., may be broadly useful in its applicability to alternative substrates, for example, polymers, conducting or non-conducting oxides, metal foils, etc., which substrates would otherwise be damaged during a typical CVD process. Such lower temperature processes may optionally employ any of a variety of different nanowire materials, including, in addition to group IV semiconductors, group III-V semiconductors and their alloys, and those that form crystals at lower temperatures, for example, Group II-VI semiconductors and their alloys. Of course, as will be appreciated, where lower temperature synthesis is desired, for example, to preserve the properties of the underlying substrate, both low melting temperature and low temperature crystal synthesis would be desired.

In addition to using films of different compositions, the morphology of the films may also be altered to adjust the properties of the wires synthesized therefrom. In particular, wire morphology resulting from metal film based growth is dependent, to some extent, upon the way in which the film melts, and coalesces during the heating/CVD process. Where larger droplets of metal catalyst form from the film, it will produce larger diameter wires, and vice versa. In other processes, a film was patterned into predetermined sized islands or patches, which would coalesce into roughly equivalently sized droplets. However, this method would require some additional up-front processing steps to pattern the metal islands.

Accordingly, in certain aspects of the invention, break points in the coalescence pattern of the metal films may be pre-designated to some extent by virtue of varying the film thickness over the surface, for example, during original deposition. In particular, by making the film thinner in certain regions and thicker in others, it will increase the probability that the coalescence breakage point, for example, where the film pulls apart from itself to form separate droplets, will form at such thinner regions, and the bulk of the droplet will be formed at the thicker regions. In fact, with the correct function of periodically varying film thicknesses, it may be possible to define not only the size of the formed droplets, but the location of their centers with accuracy that is greater than what could be achieved by simply patterning the location of catalyst islands as previously described.

Generating relatively regular deviations in the film thickness may be accomplished by a number of methods. For example, in at least one embodiment, acoustic methods are used to impose a standing wave in a forming film that includes high spots and low spots across the wave. Orthogonally directed waves then optionally provide such variation in two dimensions. A variety of mechanisms can be employed in generating such high frequency waves across the film surface, including piezoelectric transducers, and the like, that can be placed into contact with the deposition substrate during metal film deposition.

In related aspects, optical methods may be employed to impose standing wave pattern across a forming or melting metal film. Such optical methods typically employ electromagnetic radiation, where the wavelength of the electromagnetic radiation defines the perturbation periodicity across the film surface. Orthogonally directed radiation can define the pattern in two dimensions.

In a further variation, mechanical methods may be used to define surface perturbations in a metal film to enhance uniform droplet formation. In particular, e-beam lithography, nano-imprint lithography, superlattice stamping, or the like, may be used to define high and low regions in a metal film. While also useful in generating uniform droplets for wire synthesis, such mechanical methods again require an additional processing step that adds to expense and complexity of wire production, and for that reason are less favored than the other methods described herein.

In another aspect, surface perturbations are imposed in a metal film, not as a result of a force exerted over the film, but as a result of the morphology of the underlying substrate. In particular, surface variations in an underlying substrate may impart a requisite variability to any overlaying metal layer to cause substantially regular coalescence patterns for the film upon heating. In at least a first example, a polysilicon layer is provided that includes relatively regular grain boundaries between different crystal phases yielding a "stepping stone" morphology to the surface. When a film is deposited over these "stepping stones" the film will either form islands on each grain or have sufficient stresses at the grain boundary that upon heating, a pattern of coalescence will occur providing metal islands over the silicon grains.

In practice, and as shown in FIGS. 4A-4E, a substrate 400 may be provided with a deposited polysilicon layer 402, as shown in FIG. 4A. Oxidation of the poly-Si layer 402 provides an oxide 404 on the surface and at the grain boundaries 406, as shown in FIG. 4B, which is subsequently etched away, as shown in FIG. 4C. The "stepping stone" morphology then has a metal film 408 deposited thereon, as shown in FIG. 4D, which either directly forms metal islands 410 over the grain, or, upon heating, forms metal islands over the grain or boundary, based upon the differential stresses in each region, as shown in FIG. 4E. Upon exposure to the synthesis conditions, each of these metal islands then forms a catalytic particle that forms the basis for wire synthesis as described previously. This method is similar to the patterned film methods described in Published International Patent Application No. WO 03/085700 (incorporated herein by reference in its entirety for all purposes), except that it relies upon the existing surface morphology of the underlying substrate as the patterning mechanism, as opposed to relying upon an additional patterning step.

In another aspect of the invention, multiple layers of nano-thickness films (e.g., films having a thickness of less than about 10 nm) can be used wherein one overlying film layer acts as a mask for exposing underlying film regions that can be selectively removed by etching, to provide isolated island regions of the underlying film that can be used to promote the growth of relatively clean, isolated, and substantially aligned nanowires by eliminating unwanted nanowire growth around the growing wires.

Figure 5A:
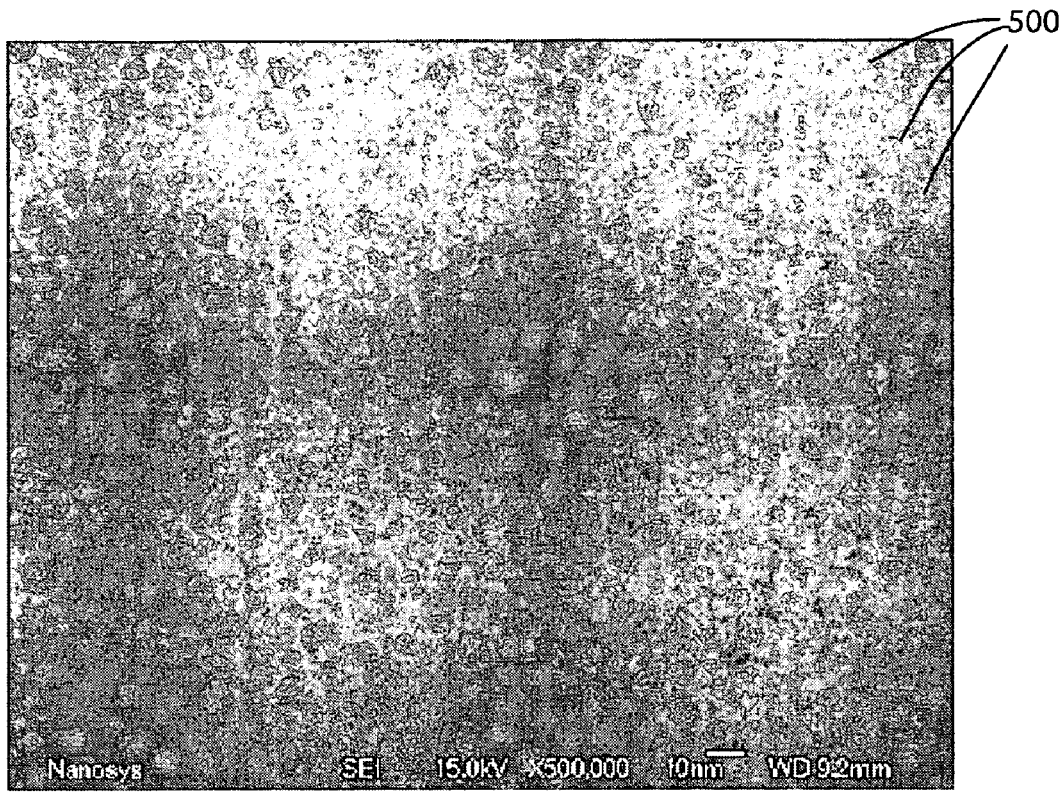
FIG. 5A is an SEM image of a 1.2 nm Au film showing that such film forms island clusters that can be used to nucleate nanowire growth.
Figure 5B:
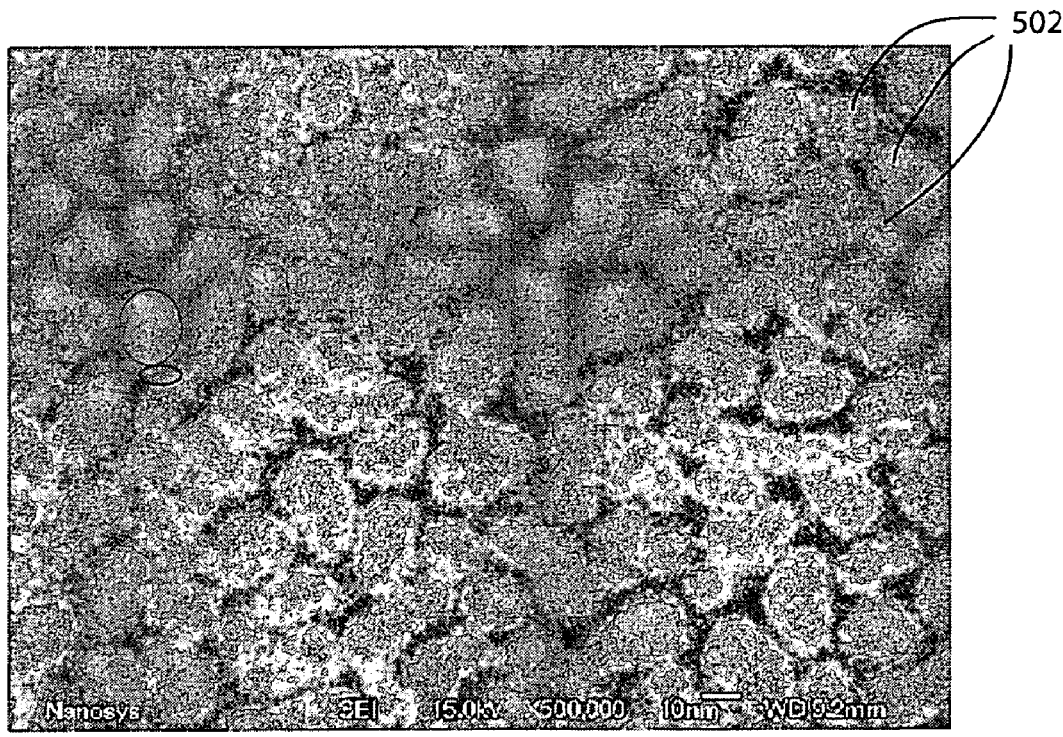
FIG. 5B is an SEM image of a 5.0 nm Cr film showing larger diameter island clusters as compared to the thinner film of FIG. 5A.

FIG. 5A is an SEM image of a 1.2 nm Au film showing that such film forms island clusters that can be used to nucleate nanowire growth. FIG. 5B is an SEM image of a 5.0 nm Cr film showing larger diameter island clusters as compared to the thinner film of FIG. 5A.

As shown for example in FIGS. 5A-B, nano-thickness films form island clusters 500 and 502 that can be used as etch masks for lithography. Films with greater thicknesses (e.g., film in FIG. 5B having a thickness of about 5.0 nm) tend to form larger island clusters 502 than those with relatively smaller thicknesses (e.g., as shown by the 1.2 nm thickness film of FIG. 5A). For example, as shown in FIG. 5B, nano-thickness films on the order of about 5.0 nm in thickness tend to produce island clusters 502 having an average diameter of between about 300 and 500 nm, while nano-thickness films having a thickness of about 1.2 nm tend to form island clusters 500 having an average diameter of between about 80 to 150 nm as shown in FIG. 5A.

Figure 5C:
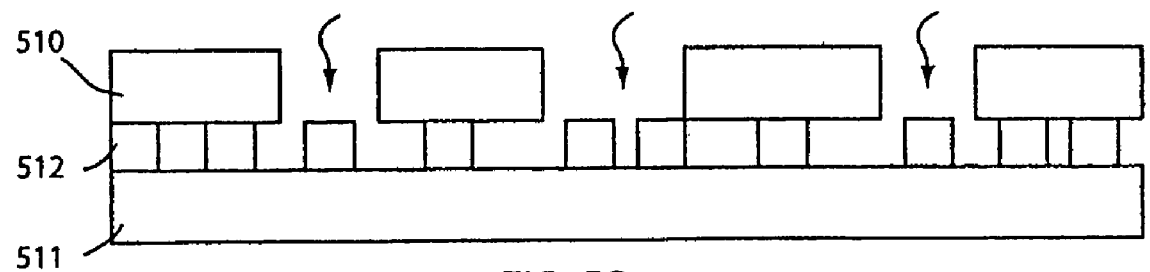
FIG. 5C is a schematic representation of the film of FIG. 5B shown overlaying the film of FIG. 5A and illustrating how the islands of the overlying film mask selected island portions of the underlying film.

Based on this understanding, and as shown with reference to FIGS. 5C-F, in this aspect of the invention, a first nano-thickness film of less than about 10 nm (for example, a 1.2 nm thick film as shown in FIG. 5A) of a first catalyst material (e.g., Au) is deposited on a growth substrate 511. Then the first film is overlaid with at least one second thin film having the same or a different thickness (e.g., a film having a thickness of about 5.0 nm as shown in FIG. 5B) than the first thin film. The second nano-thickness film is made from a second material (e.g., Cr or other suitable material) from the first catalyst material so that the first and second films can be differentially etched. Both nanothickness films form island clusters 510, 512 as shown in FIG. 5C when overlaid on top of one another.

Figure 5D:
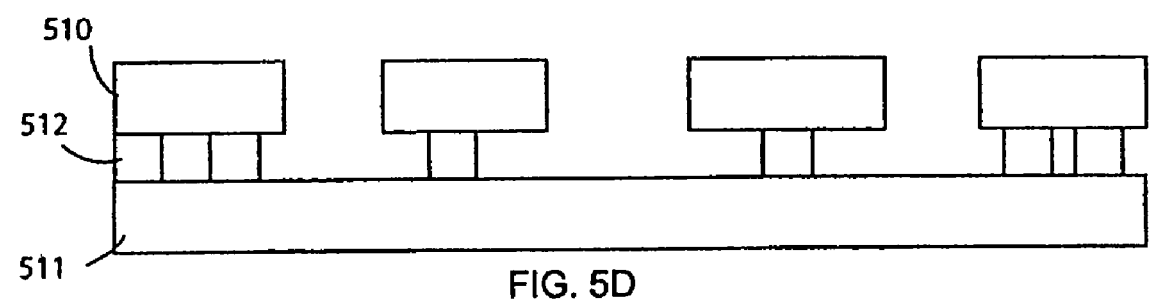
FIG. 5D shows the films of FIG. 5C following etching of exposed regions of the underlying film.
Figure 5E:
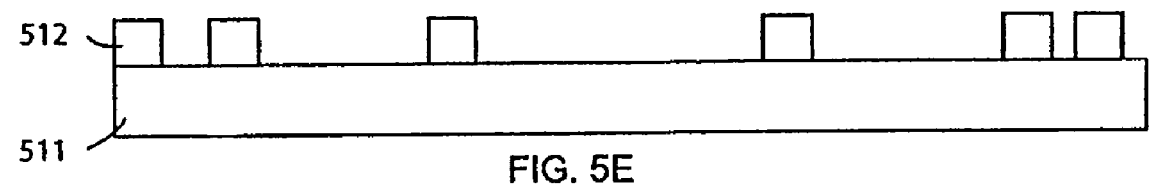
FIG. 5E shows removal of the overlying thin film following selective etching of the film.
Figure 5F:
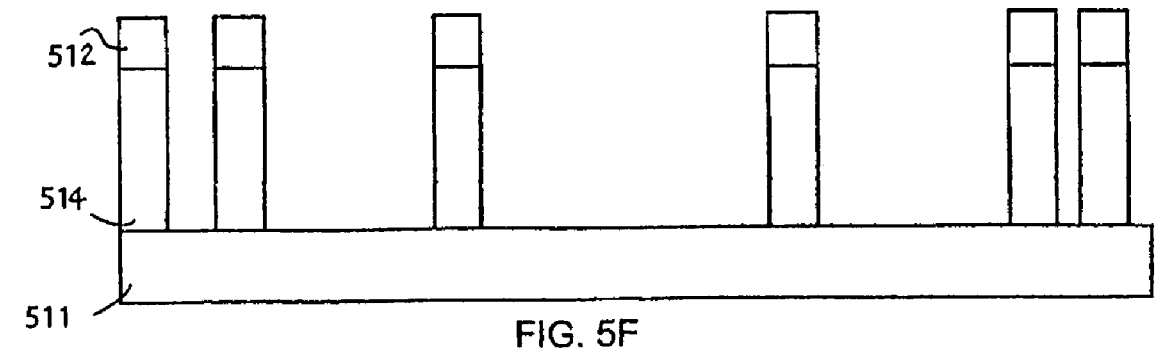
FIG. 5F shows nanowire growth from the remaining catalyst islands of the underlying thin film.

As shown in FIG. 5D, an etchant (e.g., a wet etchant such as Transene TFA gold etchant (42% KI 3% I w/balance in $H_2O$)) is then used to selectively etch the first underlying thin film (e.g., Au) to remove selected exposed regions of it from the growth substrate 511. The island clusters 510 of the second thin film serve as an etch mask for masking selected portions of the first thin film and exposing other portions of the film that can be selectively removed by etching. Following removal of the exposed regions of the underlying thin film, the second thin film may then optionally be removed by etching (e.g., using a Chromium wet etchant such as Cyantek CR-14) as shown in FIG. 5E. The remaining portions 512 of the first thin film not removed by etching can then be used to initiate nanowire growth. The first substrate and remaining portions of the first thin film are heated to a temperature at which the first thin film melts. A semiconductor (e.g., Si for Si nanowires) is then vapor deposited onto the first substrate, and nanowire growth occurs as catalyzed by the first catalyst material, to grow nanowires 514 at the site of the catalyst islands 512, as shown in FIG. 5F. By removing excess amounts of the first film 512 by etching, it is possible to largely eliminate unwanted growth of nanowires of random diameters and length on the growth substrate. This unwanted nanowire growth can interfere with post-processing of nanowires either done on the growth substrate or after the nanowires are removed from the substrate. Reduction of unwanted nanowire growth thereby enables the production of clean, isolated and substantially aligned nanowires for multiple device applications and facilitates post-processing (e.g., harvesting) of the wires.

Alternatively, to further enhance nanowire growth from the first (underlying) thin film, the final etched substrate may be coated with a colloid suspension of the first catalyst material (e.g., Au). If the colloid has an affinity for the remaining portions of the first thin film not removed by etching, but not the underlying substrate, these colloids will co-locate with the remaining portions of the first thin film. The first thin film and colloid composite may then be used to initiate nanowire growth. Alternatively, if the colloids have an affinity for the underlying substrate, but not the remaining regions of the first thin-film not removed by etching, these colloids will co-locate with the exposed underlying substrate regions. The first thin-film and colloids may then be used to initiate nanowire growth simultaneously in different regions of the substrate.

In one embodiment, the first underlying thin film may be Au or Cr (or any other suitable metal or semiconductor (e.g., Si, Ge, etc.) film), and the second overlying, masking thin film may be Cr or Au (or any other suitable thin film). Alternatively, lower melting point metal films as described above can be used, such as In, Cd, Sn, Zn, or alloys thereof, and the like. Typically, any metal that generate eutectics with the semiconductor material being used for nanowire growth at a temperature less than about 400° C., may be broadly useful in its applicability to alternative substrates, for example, polymers, conducting or non-conducting oxides, metal foils, etc., can be used, which substrates would otherwise be damaged during a typical CVD process. Such lower temperature processes may optionally employ any of a variety of different nanowire materials, including, in addition to group IV semiconductors, group III-V semiconductors, and those that form crystals as lower temperatures, e.g., Group II-VI semiconductors.

Alternatively, the underlying film for initiating nanowire growth can be a nano-thickness silicon film on a silicon-on-insulator (SOI) substrate, and a single nano-thickness film such as Au or Cr (or other suitable thin film) may be overlaid on the silicon film layer to mask selected regions of it. The exposed portions of the silicon film layer between the island clusters of the overlaying film layer can then be selectively removed by etching (e.g., using a silicon dry etching process) to leave selected portions of the underlying silicon film intact on the SOI substrate. The remaining portions of the silicon film can then be used to initiate nanowire growth (e.g., following wet etching to remove the overlying film layer).

In another aspect of the invention shown with reference to FIGS. 6A-D, the invention provides a method for producing nanowires that comprises providing a patterned thin film of a catalyst material on a growth substrate, selected regions of the thin film are partially etched where nanowire growth is desired. A population of nanowires is then grown in the partially etched regions of the film. The film is preferably a nano-thickness film of less than about 10 nm in thickness, for example between about 1 to about 7 nm in thickness, for example between about 1 and 5 nm in thickness.

Figure 6A:
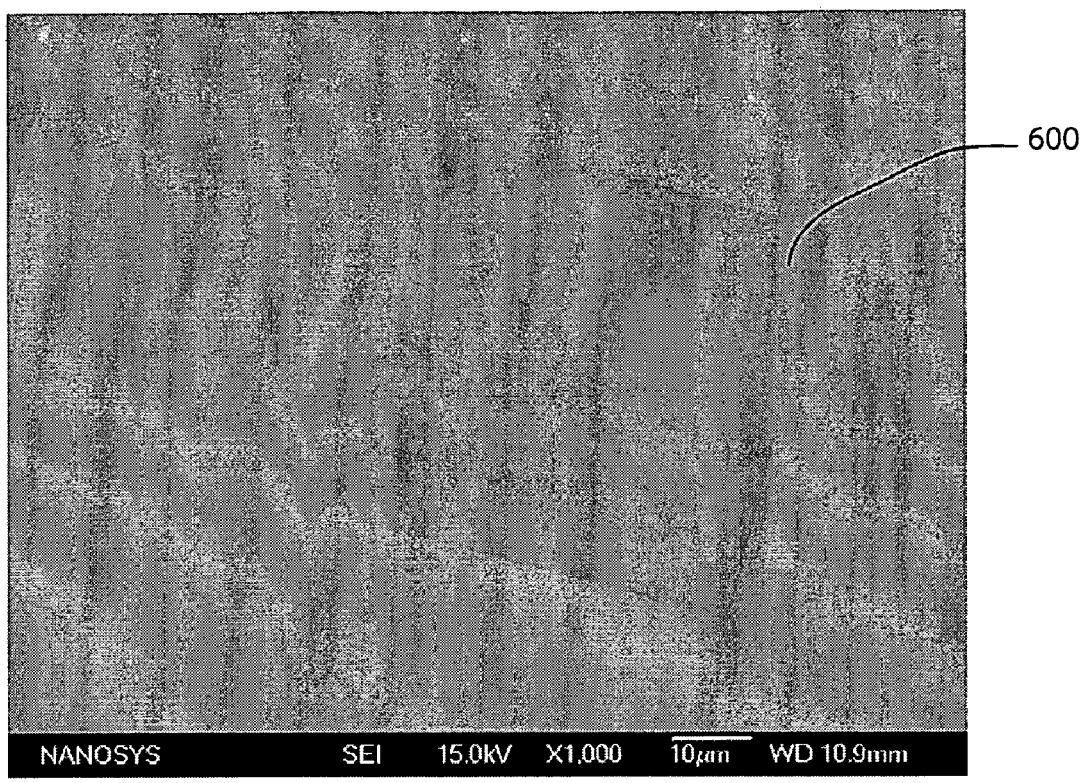
FIG. 6A is an SEM image of a patterned Au film grown on a Si growth substrate prior to nanowire growth showing etched region 1100 that has been etched for about 5 seconds.
Figure 6B:
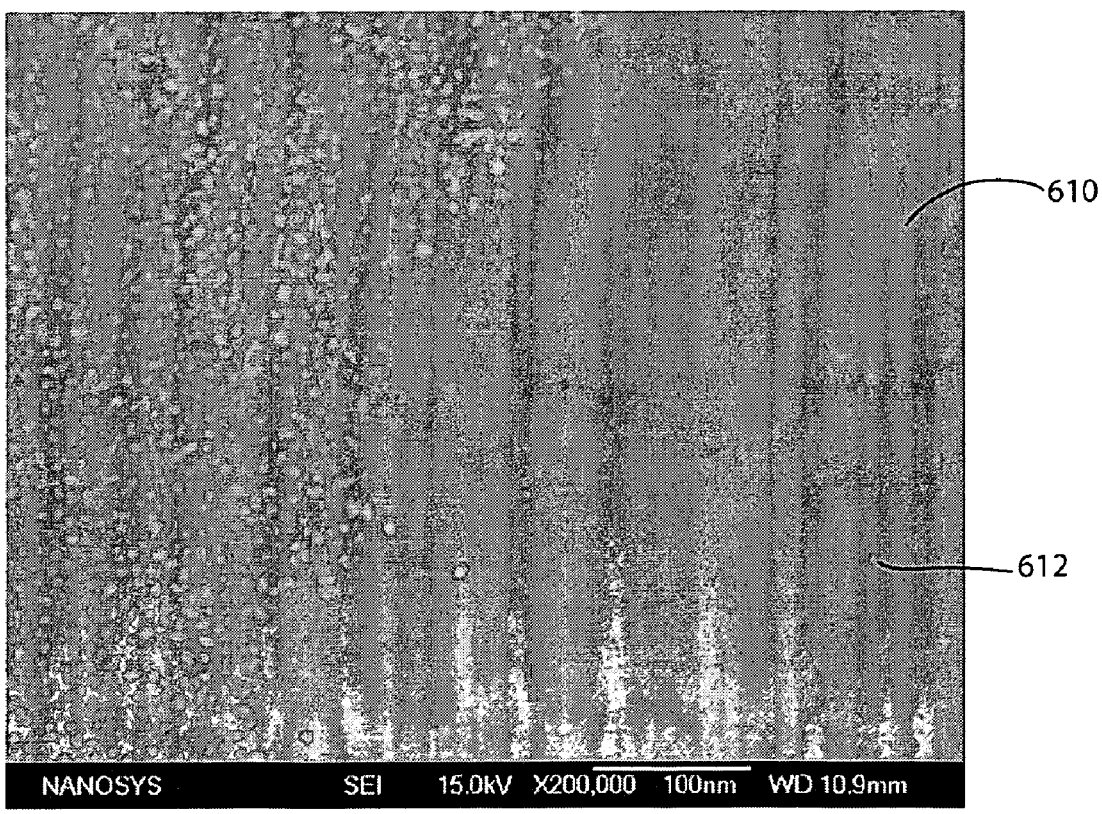
FIG. 6B is a 200× magnified SEM image of the Au film of FIG. 6A showing that controlled etching of the Au film reduces the density of island clusters in the etched region by approximately a factor of ten versus the density of island clusters in the masked (e.g., non-etched) regions of the film.

For example, FIG. 6A is a SEM image of a patterned Au film grown on a Si growth substrate prior to nanowire growth showing a rectangular-shaped etched region 600 that has been etched for about 5 seconds. The etched region is created by wet etching selected patterned regions of the Au film using a gold wet etchant without any photolithography. FIG. 6B is a 200× magnified version of the Au film of FIG. 6A showing that controlled etching of the Au film reduces the density of island clusters 612 in the etched region by approximately a factor of ten versus the density of island clusters in the masked (e.g., non-etched) regions of the film on the left side of FIG. 6C.

Figure 6C:
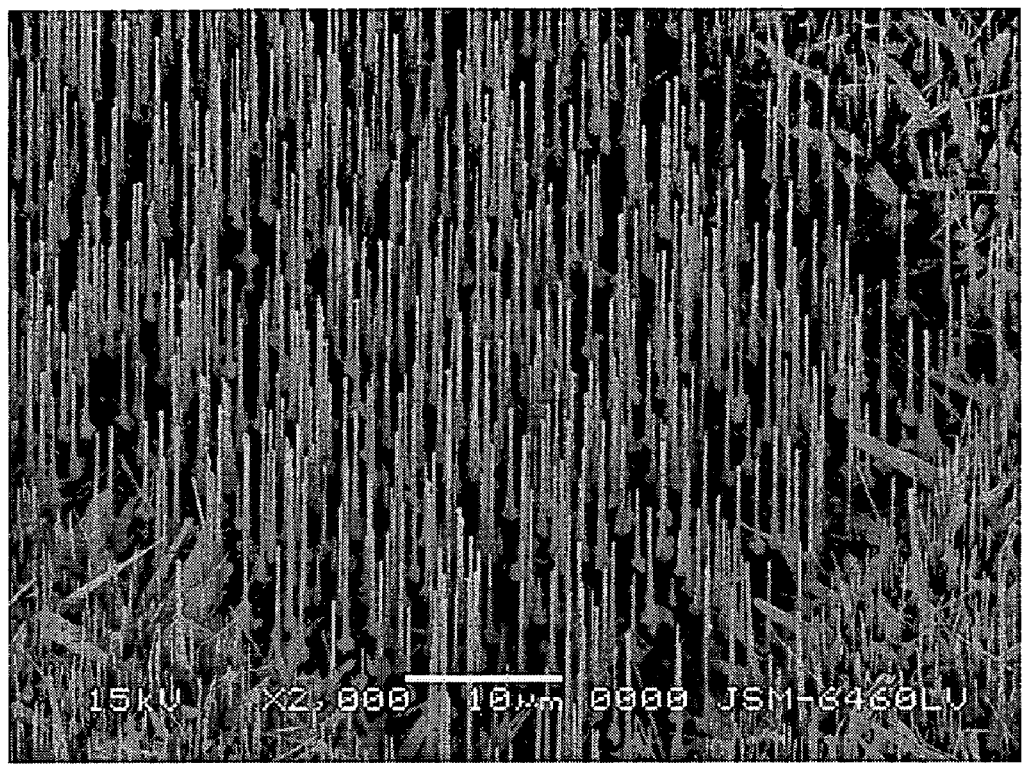
FIG. 6C is an SEM image of the Au film of FIG. 6A after nanowire growth showing that nanowires grown in the etched regions of the Au film were found to be substantially oriented, and growth occurred without substantial background growth as compared to the other non-etched regions of the film.
Figure 6D:
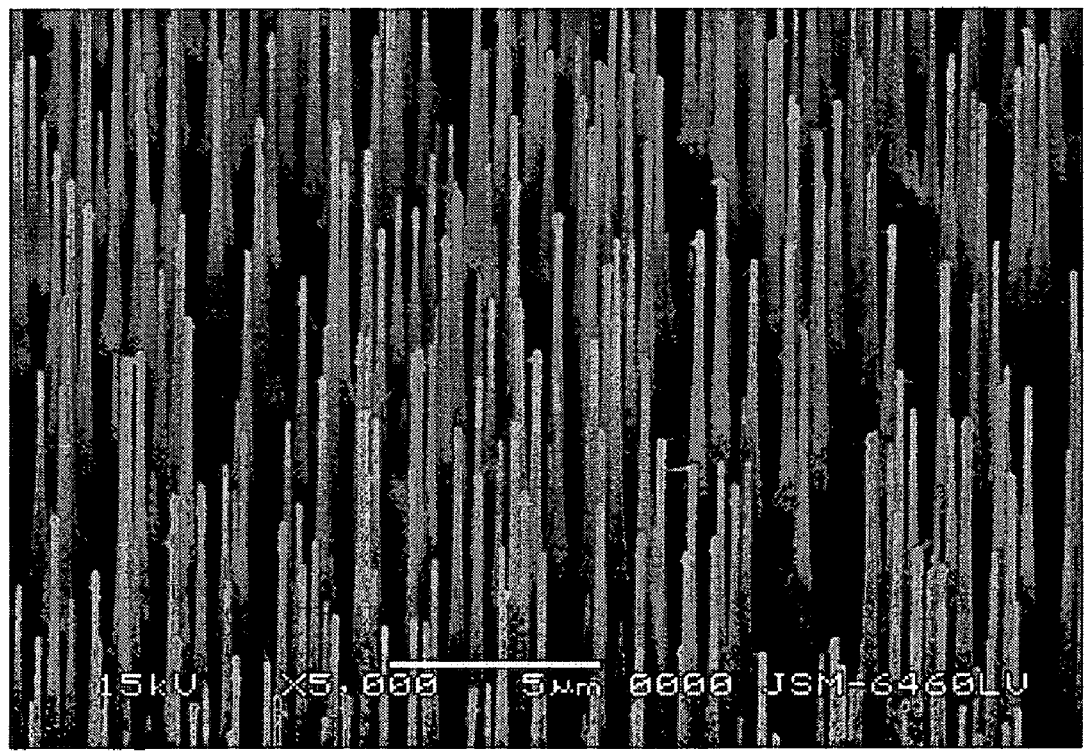
FIG. 6D is a high-magnification SEM image of the Au film of FIG. 6C.

As shown in the low and high magnification SEM images of FIGS. 6C and 6D, respectively, "clean" nanowires grown in the etched regions of the Au film were found to be substantially oriented, and growth occurred without substantial background growth as compared to the other non-etched regions of the film. Nanowires grown in non-etched regions can be seen in the upper right and lower right and right corners of FIG. 6C. Thus, controlled etching of selected regions of such films reduces the island density in those regions which enables the growth of isolated and substantially oriented nanowires while minimizing background growth, thereby simplifying post-growth processing of the wires.

Use of Nanowires of the Present Invention in Exemplary Devices and Applications

Numerous electronic devices and systems can incorporate semiconductor or other type devices with thin films of nanowires produced by the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires produced by the processes of the present invention can also be incorporated in applications requiring a single semiconductor device, and to multiple semiconductor devices. For example, the nanowires produced by the processes of the present invention are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires produced by the processes of the present invention are also applicable to smart libraries, credit cards, large area array sensors, and radio-frequency identification (RFID) tags, including smart cards, smart inventory tags, and the like.

The nanowires produced by the processes of the present invention are also applicable to digital and analog circuit applications. In particular, the nanowires produced by the processes of the present invention are useful in applications that require ultra large-scale integration on a large area substrate. For example, a thin film of nanowires produced by the processes of the present invention can be implemented in logic circuits, memory circuits, processors, amplifiers, and other digital and analog circuits.

The nanowires produced by the processes of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires produced by the processes of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method for producing nanowires comprising:
    providing at least a first thin film of a first catalyst material on a growth substrate;
    overlying the first thin film with at least one second thin film made from a second material different than the first catalyst material, the second thin film forming a plurality of islands on the first thin film;
    selectively etching the first underlying thin film, whereby the plurality of islands of the second thin film mask selected portions of the first thin film and expose other regions of the first thin film that are removed by etching; and
    growing a population of nanowires on the first thin film.

2. The method of claim 1, wherein the first thin film has a different thickness than the second thin film.

3. The method of claim 2, wherein the first thin film is thinner than the second thin film.

4. The method of claim 1, wherein the first thin film is less than about 10 nm in thickness.

5. The method of claim 1, wherein the first thin film is less than about 5 nm in thickness.

6. The method of claim 1, wherein the first thin film is less than about 2 nm in thickness.

7. The method of claim 1, wherein the second thin film is less than about 10 nm in thickness.

8. The method of claim 1, wherein the second thin film is less than about 5 nm in thickness.

9. The method of claim 1, further comprising removing the second thin film by etching following the step of selectively etching the first thin film.

10. The method of claim 9, further comprising coating at least a portion of the first thin film with a colloid suspension of the first catalyst material.

11. The method of claim 10, wherein the first catalyst material comprises gold (Au).

12. The method of claim 11, wherein the second catalyst material comprises chromium (Cr).

* * * * *